United States Patent

Nambu

[19]

[11] Patent Number: 6,031,859
[45] Date of Patent: Feb. 29, 2000

[54] MODE-LOCKED SEMICONDUCTOR LASER

[75] Inventor: Yoshihiro Nambu, Tokyo, Japan

[73] Assignee: NEC Corporation, Tokyo, Japan

[21] Appl. No.: 08/914,106

[22] Filed: Aug. 19, 1997

[30] Foreign Application Priority Data

Sep. 11, 1996 [JP] Japan .................................. 8-240347

[51] Int. Cl.$^7$ .............................. H01S 3/19; H01S 3/098; H01S 3/10
[52] U.S. Cl. ................................. 372/50; 372/18; 372/45; 372/26
[58] Field of Search ................................. 372/50, 18, 20, 372/45, 26

[56] References Cited

U.S. PATENT DOCUMENTS

| | | | |
|---|---|---|---|
| 5,208,822 | 5/1993 | Haus et al. | 372/50 |
| 5,214,664 | 5/1993 | Paoli | 372/50 |
| 5,274,649 | 12/1993 | Hirayama et al. | 372/50 |
| 5,539,763 | 7/1996 | Takemi et al. | 372/50 |
| 5,802,084 | 9/1998 | Bowers et al. | 372/18 |
| 5,812,574 | 9/1998 | Takeuchi et al. | 372/45 |

FOREIGN PATENT DOCUMENTS 1-17487  1/1989  Japan .
5-291700 11/1993  Japan .

OTHER PUBLICATIONS

D.J. Jones et al., "Dynamics of Monolithic Passively Mode–Locked Semiconductor Lasers", *IEEE Journal of Quantum Electronics*, vol. 31, No. 6, Jun. 1995, pp. 1051–1058.
Dennis J. Derickson, et al., "Short Pulse Generation Using Multisegment Mode–Locked Semiconductor Lasers", *IEEE Journal of Quantum Electronics*, vol. 28, No. 10, Oct. 1992, pp. 2186–2203.

*Primary Examiner*—Rodney Bovernick
*Assistant Examiner*—Quyen Phan Leung
*Attorney, Agent, or Firm*—Young & Thompson

[57] ABSTRACT

A mode-locked semiconductor laser includes a gain region formed from a semiconductor gain material of two or three dimensional carrier confinement structure having a size on the order of a thermal de-Broglie wavelength, the size of the semiconductor of the carrier confinement structure being controlled such that the gain spectrum has discrete peaks at a frequency period which is an integer power of the reciprocal of the round-trip time of light in the optical resonator.

16 Claims, 2 Drawing Sheets

MODE-LOCKED SEMICONDUCTOR LASER

BACKGROUND OF THE INVENTION

1. Field of the Invention

The present invention relates to a mode-locked semiconductor laser that generates ultra-short light pulses that can be used for, for example, optical data processing or optical communication.

2. Description of the Related Art

Mode-locked semiconductor lasers are expected to serve as a means of easily obtaining ultra-fast light pulses which are useful for such applications as optical communication or optical information processing systems. The two forms of realizing mode-locked semiconductor lasers are passively mode-locked semiconductor lasers and actively mode-locked semiconductor lasers.

As shown in FIG. 1, this example includes a waveguide structure which is electrically divided into a gain region 21 and saturable absorption region 22 with current being injected or a bias voltage being applied independently to each region.

Saturable absorption region 22 possesses a saturation characteristic whereby its own absorption coefficient decreases by absorption of light when an appropriate reverse bias voltage is applied.

The end surface of gain region 21 is a facet produced by, for example, cleavage, that contacts the air and functions as a reflecting mirror having a reflectivity of approximately 30%. In contrast, the end surface on the side of saturable absorption region 22 is a reflecting mirror 26 having a reflectivity approaching 100% that is produced by coating a dielectric multilayer film, and forms an optical resonator structure.

It is known that, a semiconductor laser of this configuration makes a self-pulsating operation on a self-starting mode-locking operation by adjusting the current injected into gain region 21 and the reverse bias voltage applied to saturable absorption region 22.

As shown in FIG. 2, this example of the prior art includes a waveguide structure 38 made up of three regions: gain region 31, saturable absorption region 32, and gain modulation region 33. According to this configuration, gain region 31, saturable absorption region 32, and gain modulation region 33 are electrically isolated each other, and current is injected or a bias voltage is applied separately to each region.

Moreover, both end surfaces of waveguide structure 38 are end facets surfaces produced by, for example, cleavage, that contact the air and function as reflecting mirrors having a reflectivity of approximately 30%, thereby forming an optical resonator structure.

Current is injected from a direct current source to gain region 31. Reverse bias voltage is applied to saturable absorption region 32. Forward bias voltage modulated at a period that is an integer power of the round-trip time of light in the optical resonator is applied to gain modulation region 33 from an external power source.

It is known that in a semiconductor laser of this configuration, mode-locking operation can be achieved by adjusting the current injected to gain region 31, the reverse bias voltage applied to saturable absorption region 32, as well as the modulation depth and frequency of the current injected to gain modulation region 33.

The two examples of the prior art described hereinabove are monolithic mode-locked semiconductor lasers, where on optical resonator is made on the waveguide structure by two end cleaved facets. However, another form also exists in which one or two of the above-described cleaved facets are replaced by a diffraction grating that functions as an external wavelength-selective reflecting mirror, thereby forming an external resonator. In an external resonator, the round-trip time within the resonator can be extended by lengthening the resonator (cavity), thereby allowing a low repetition rate of pulsed light to be obtained.

Normally, the typical repetition rate is more than 10 GHz in a monolithic mode-locked semiconductor laser.

However, the above-described mode-locked semiconductor lasers of the prior art have the following drawbacks:

(1) For passively mode-locked semiconductor lasers, the structure of the laser must be adequately optimized to meet the self-starting conditions of the mode-locking operation. However, since the design principles for such optimization are not yet clearly understood, the manufacture of a sample having a variety of structures entails a process of trial and error in order to arrive at an element that can satisfy self-starting conditions, and as a result, the yield rate for elements is poor and design modification of elements has been difficult.

(2) For passively mode-locked semiconductor lasers, even if an element that can meet the self-starting conditions is obtained, the mode-locking conditions are constrained, and use under desired conditions (power, repetition, etc.) has therefore been difficult.

(3) For actively mode-locked semiconductor lasers, the mode-locking conditions are again constrained, and use under desired conditions (power, repetition, etc.) has been difficult.

(4) Both passively and actively mode-locked semiconductor lasers have low stability of pulse repetition rate and a high level of jitter.

These problems must be solved if mode-locked semiconductor lasers are to serve as a clock source in optical information processing systems.

SUMMARY OF THE INVENTION

The object of the present invention is to provide a mode-locked semiconductor laser which has few operation limitations in design, a wide range of operating conditions, a low level of jitter, and excellent stability.

To achieve the above-described objects, the present invention comprising:

a gain region that emits and amplifies light; and a saturable absorption region that absorbs light emitted by the gain region, thereby causing a reduction of its own absorption coefficient;

the gain region is formed from a semiconductor gain material having a two-dimensional or three-dimensional carrier confinement structure having a size on the order of a thermal de-Broglie wavelength, and moreover, the size of the semiconductor of the carrier confinement structure is controlled such that the gain spectrum has discrete peaks at frequency periods of integer powers of the reciprocal of the round-trip time of the optical resonator.

In addition, the present invention comprising:

a gain region that emits and amplifies light, and an optical modulation region that modulates the amplitude or phase of light by altering optical characteristics based on externally applied signals from the outside;

the gain region is formed from a semiconductor gain material having a two-dimensional or three-dimensional carrier confinement structure having a size on the order of a thermal de-Broglie wavelength, and moreover, the size of the semiconductor of the carrier confinement structure is controlled such that the gain spectrum has discrete peaks at frequency periods of integer power of the reciprocal of the cavity round-trip time of the optical resonator.

The fundamental effects of the invention constructed as described in the foregoing explanation will next be explained.

In recent years, there has been extensive applied research for electronic and optical devices of micro-size, low-dimensional carrier confinement structures, referred to as quantum wires or quantum dots. These low-dimensional carrier confinement structures are characterized by a confinement size on the order of the thermal de Broglie wavelength $\lambda_T$ ($\lambda_T = h/(2 \pi m k_B T)^{1/2}$; m being the effective mass of the carrier), and it is expected that these structures show an effect known as the quantum effect.

For an optical device, the advantage of a low-dimensional carrier confinement structure (hereinbelow referred to as a "quantum confinement structure") of such sizes is that these system has steep density of states spectrum. Stated in terms of physics, this means that transition energy of dipoles (electron hole pairs) that can exist within a medium can be concentrated at a particular discrete value. This result is enabled because non-separatability of the carrier is lost by spatially confining the carrier, thereby relaxing the Pauli exclusion principle (when the Pauli exclusion principle is not in effect, there is no exchange interaction and no degeneration of energy levels).

The present invention takes advantage of the characteristic of quantum confinement structure in which confinement size can be freely and artificially designed and controlled. In a quantum confinement structure, the transition energy can be controlled by controlling the size of each quantum structure, whereby the shape of the density of states of the total system, can be controlled at will. By taking advantage of this characteristic, the gain spectrum of a quantum confinement system can be freely designed.

If the number of spherical quantum dot structures having a radius R is N(R), the density of states of the total system is given by dN/dE, where E is the transition energy. Thus, a desired density of states can be produced by controlling N(R). If a distance between adjacent quantum structures is sufficiently large, which a sufficient distance exists between adjacent, excitation transfer between quantum structures can be ignored, and, because the carriers are equally injected at equal probability in these quantum structures, a gain spectrum should be obtained that is directly proportional to the shape of the density of states.

The present invention employs the above-described principles to manufacture, a gain medium having a discrete gain spectrum with a frequency period which is equivalent to an integer power of the repetition rate of the mode-locking (a reciprocal of the round-trip time) by controlling a size of quantum confinement structures, and uses this product as the gain medium of a mode-locked semiconductor laser.

As is well known in the art, the oscillation spectrum of a mode-locked laser is discrete at the frequency period equal to the repetition rate of the mode-locking. This spectrum is broken in cases in which mode locking is unstable or not achieved. Here, mode locking can be stabilized if, in advance, a gain medium is used that has a gain spectrum resembling the shape of the spectrum during mode locking. Accordingly, if a gain medium is used that has this type of discrete gain spectrum, a mode-locked semiconductor laser can be realized that overcomes the problems of the prior art, and moreover, that offers stability over a wide range of operating conditions.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Embodiments of the present invention will next be explained with reference to the accompanying figures.

Figure 1:
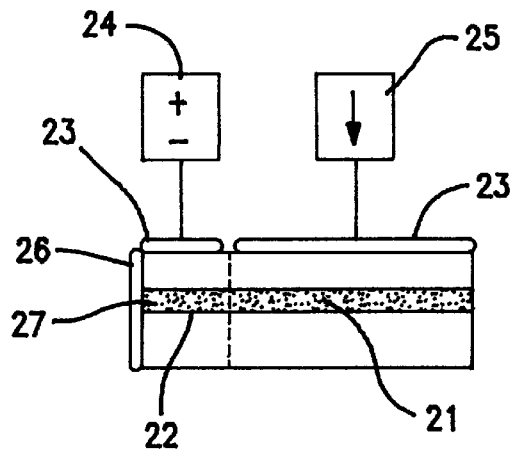
FIG. 1 is a schematic structural view of one example of a passively mode-locked semiconductor laser of the prior art.
Figure 2:
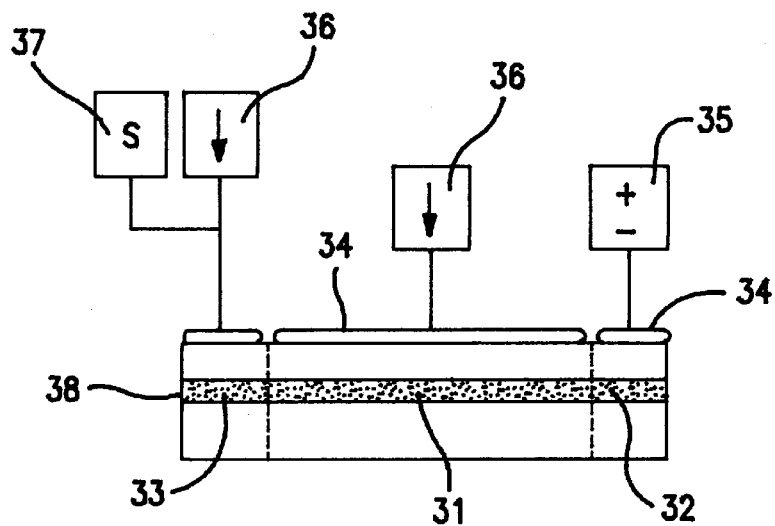
FIG. 2 is a schematic structural view of one example of an actively mode-locked semiconductor laser of the prior art.
Figure 3A:
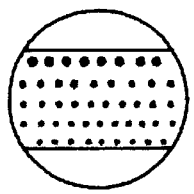
FIGS. 3A and 3B are sectional view showing one embodiment of the mode-locked semiconductor laser of the present invention.
Figure 3B:
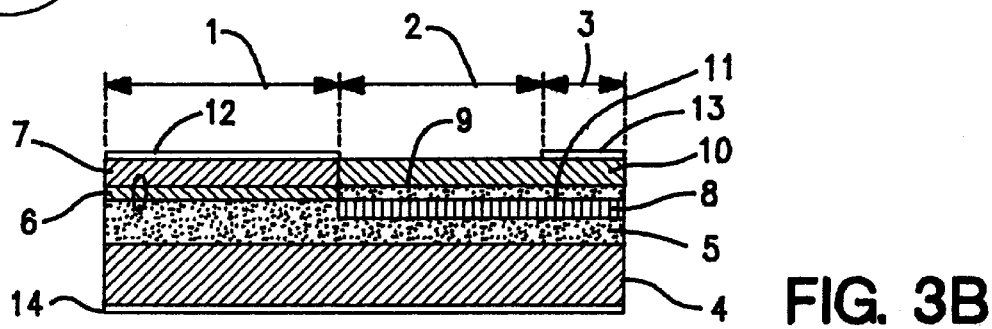

In this embodiment, as shown in FIGS. 3A and 3B, electrodes positioned in an epitaxial growth surface are divided into two or more electrodes (two p-type electrodes 12 and 13 in the figure) on either side of an interposed low-loss waveguide region 2 and are electrically divided into a gain region 1 that emits and amplifies light, and a saturable absorption region 3 that absorbs light that is emitted from gain region 1 and guided through waveguide region 2, thereby reducing its own absorption coefficient.

Next, regarding the method of fabricating the mode-locked semiconductor laser shown in FIG. 3B.

N-InP clad layer 5 is first grown on n-InP substrate 4 using a thin-film growth apparatus based on, for example, MOVPE (Metal Organic Vapor-Phase Epitaxy).

Next, an InGaAsP quantum dot structure is formed on n-InP clad layer 5 by, for example, a Stranski-Krastranow growth method (a quantum dot structure growing method that uses the change in growth mode from two-dimensional growth to three-dimensional growth when growing a strained semiconductor layer), and then buried by i-InP. This process is repeated and active layer 6 is formed that includes a numbers of InGaAsP quantum dot layers.

Next, p-InP clad layer 7 is grown on active layer 6. Then, the regions corresponding to waveguide region 2 and saturable absorption region 3 are removed to the middle of n-InP clad layer 5 by a method such as chemical etching.

Next, using a growing apparatus based on, for example, MOVPE, n-InP clad layer 8 is grown on n-InP clad layer 5 of the regions corresponding to waveguide region 2 and saturable absorption region 3; waveguide layer 9 having a composition in which the bandgap energy is greater than the laser transition energy is grown on n-InP clad layer 8, and p-InP clad layer 10 is grown on waveguide layer 9.

Next, p-type electrode 12 for injecting current is formed on p-InP clad layer 7, which is formed on gain region 1; and p-type electrode 13 for applying reverse bias voltage is formed on the portion corresponding to saturable absorption region 3 on p-InP clad layer 10.

The substrate is then polished and n-type electrode 14 is formed on the obverse surface of n-InP substrate 4.

By applying reverse bias voltage, an electric field is applied which causes the bandgap to shrink due to the Franz-Keldysh effect, and as a result, the lower portion of p-type electrode 13 of saturable absorption region 3 functions as saturable absorption layer 11.

In addition, due to cleavage, both ends of the element act as reflecting mirrors having a reflectivity of about 30%, thereby constituting an optical resonator.

In the present embodiment, active layer 6 is formed from a semiconductor gain material having a two-dimensional or three-dimensional carrier confinement structure having a size on the order of a thermal de Broglie wavelength. The mode-locked semiconductor laser according to this embodiment is further constructed such that the size of the carrier confinement structure is controlled such that the gain spectrum has discrete peaks at the frequency period of an integer power of the reciprocal of the cavity round-trip time of the optical resonator. For this purpose, the growth conditions for each quantum dot are altered such that quantum dot in every layer has a different transition frequencies.

If the quantum dot structure is approximated to spheres of radius R, the transition energy of lowest excitation level can be approximately given by:

$$E = E_g + \frac{h^2 \pi^2}{2R^2}\left(\frac{1}{m_e} + \frac{1}{m_h}\right) \quad \text{(Equation 1)}$$

wherein $E_g$ is the band-gap energy, and $m_e$ and $m_h$ are the effective masses of an electron and hole, respectively.

Growing conditions are changed for each quantum dot layer, thereby enabling formation of quantum dot with size differing for every quantum dot layer, and further, enabling quantum dot layers with the transition energy differing for every quantum dot layer.

Figure 4A:
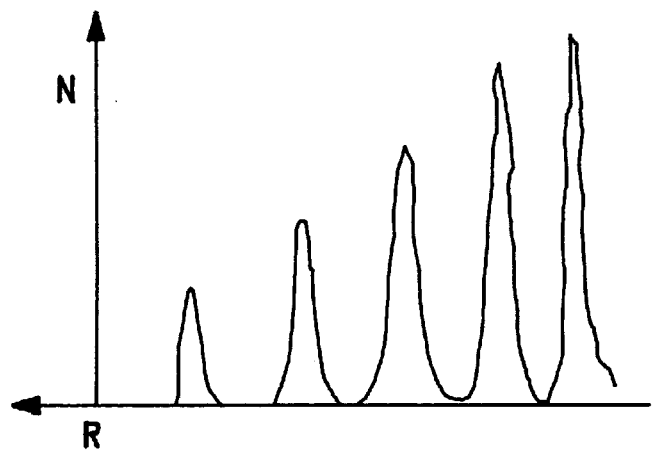
FIG. 4a shows the dependence of the number of quantum dots on the quantum dot size in active layer 6 shown in FIG. 3A.
Figure 4B:
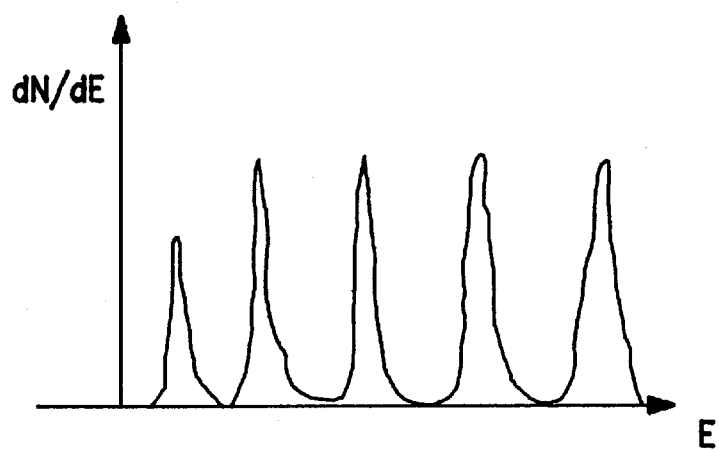
FIG. 4b shows the density of states spectrum in active layer 6 shown in FIG. 3A.
Figure 4C:
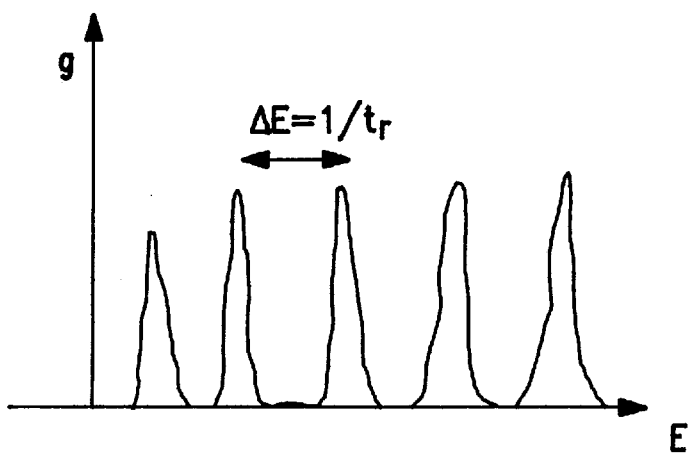
FIG. 4c shows the gain spectrum in active layer 6 shown in FIG. 3A.

As shown in FIG. 4, the gain spectrum in the active layer reflects the change in quantum dot size for every quantum dot layer and has a discrete spectrum configuration. Here, growth conditions are adjusted such that the energy intervals ΔE of this discrete spectrum coincide with the reciprocal of the round-trip time $t_r$ of in the optical resonator.

In this way, stable mode locking can be added to the normal operating principles of a normal passively mode-locked semiconductor laser.

It has been ascertained that excellent characteristics can be obtained when using the passively mode-locked semiconductor laser of this embodiment, with the range of operating conditions five to ten times broader than and the magnitude of jitter just one-tenth that of a passively mode-locked semiconductor laser of the prior art.

Moreover, an optical modulation region may be provided in place of saturable absorption region 3 that modulates the amplitude or phase of light by varying optical characteristics such as the absorption coefficient or the refractive index based on externally supplied signals.

While explanation has been presented in this embodiment using a particular semiconductor material as an example, the present invention is not limited to such a material. In this embodiment, explanation was presented based on the example of a mode-locked semiconductor laser in which InGaAs was used in the quantum confinement structure and InP was used in the barrier layer, but a mode-locked semiconductor laser may also be applied in which other semiconductor materials are used, including GaAs, InP, InGaAs, and InGaAsP.

Further, while explanation in this embodiment has been given regarding a passively mode-locked semiconductor laser having two electrodes and light-emitting end facets, it should go without saying that the present invention may be applied to other cases employing, for example, a surface emitting laser, a multi-electrode laser, an actively mode-locked semiconductor laser, or a passive-active hybrid mode-locked semiconductor laser.

Still further, in the present embodiment, explanation has been presented regarding a case in which the mode-locked semiconductor laser is constituted by a quantum dot structure, but a quantum wire structure is also possible.

In the present invention according to the foregoing description, the gain region is formed from a semiconductor gain material including two-dimensional or three-dimensional carrier confinement structure and of a size on the order of a thermal de Broglie wavelength, and the size of the semiconductor of carrier confinement structure is controlled such that the gain spectrum has discrete peaks of a frequency period that is an integer power at the reciprocal of the round-trip time of the optical resonator, thereby enabling a mode-locked semiconductor laser having a low level of jitter and excellent stability, and in which design operation limits can be relaxed and the range of operating conditions can be broadened.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A mode-locked semiconductor laser made up of an optical resonator comprising:

a gain region that emits and amplifies light, and a saturable absorption region that absorbs the light emitted by said gain region, thereby causing a reduction in its own absorption coefficient; wherein said gain region being formed from a semiconductor gain material having a size-controllable, two-dimensional carrier confinement structure having a size on the order of a thermal de-Broglie wavelength; and the size of said carrier confinement structure being controlled such that the gain spectrum has discrete peaks at frequency periods of integer powers of the reciprocal of the round-trip time of the light in said optical resonator.

2. The laser of claim 1, further comprising a substrate and an overlying lower cladding layer shared by said gain region and said saturable absorption region;

an active layer comprising said carrier confinement structure, said active layer overlying said lower cladding layer in said gain region;

a wave guide layer overlying said lower cladding layer in said saturable absorption region, wherein said active layer and said wave guide layer each have co-planar top and bottom surfaces.

3. The laser of claim 2, further comprising:

an upper cladding layer contacting and overlying said active layer and said wave guide layer;

a first electrode contacting said upper cladding layer in said gain region; and a second electrode contacting said upper cladding layer in said saturable absorption region.

4. The laser of claim 2, wherein said active layer comprises an InGaAsP quantum dot structure.

5. The laser of claim 4, wherein said active layer further comprises a plurality of overlying InGaAsP quantum dot layers.

6. The laser of claim 5, wherein each of said plurality of quantum dot layers comprises quantum dots, and wherein said quantum dots in each of said plural layers has a transition frequency different from said quantum dots in the other of said plurality of quantum dot layers.

7. The laser of claim 5, wherein each of said plurality of quantum dot layers comprises quantum dots, and wherein the quantum dots of each of said quantum dot layers is of a size different from said quantum dots in the other of said plurality of quantum dot layers.

8. A mode-locked semiconductor laser made up of an optical resonator comprising:

a gain region that emits and amplifies light, and a saturable absorption region that absorbs the light emitted by said gain region, thereby causing a reduction in its own absorption coefficient; wherein said gain region being formed from a semiconductor gain material having a size-controllable, three-dimensional carrier confinement structure having a size on the order of a thermal de-Broglie wavelength; and the size of said carrier confinement structure being controlled such that the gain spectrum has discrete peaks at frequency periods of integer powers of the reciprocal of the round-trip time of the light in said optical resonator.

9. The laser of claim 8 further comprising a substrate and an overlying lower cladding layer shared by said gain region and said saturable absorption region;

an active layer comprising said carrier confinement structure, said active layer overlying said lower cladding layer in said gain region;

a wave guide layer overlying said lower cladding layer in said saturable absorption region, wherein said active layer and said wave guide layer each have co-planar top and bottom surfaces.

10. The laser of claim 9, further comprising:

an upper cladding layer contacting and overlying said active layer and said wave guide layer;

a first electrode contacting said upper cladding layer in said gain region; and a second electrode contacting said upper cladding layer in said saturable absorption region.

11. The laser of claim 9, wherein said active layer comprises an InGaAsP quantum dot structure.

12. The laser of claim 11, wherein said active layer further comprises a plurality of overlying InGaAsP quantum dot layers.

13. The laser of claim 12, wherein each of said plurality of quantum dot layers comprises quantum dots, and wherein said quantum dots in each of said plural layers has a transition frequency different from said quantum dots in the other of said plurality of quantum dot layers.

14. The laser of claim 12, wherein each of said plurality of quantum dot layers comprises quantum dots, and wherein the quantum dots of each of said quantum dot layers is of a size different from said quantum dots in the other of said plurality of quantum dot layers.

15. A mode-locked semiconductor laser made up of an optical resonator comprising:

a gain region that emits and amplifies light, and an optical modulation region that modulates an amplitude or a phase of the light by altering optical characteristics based on externally supplied signals; wherein said gain region being formed from a semiconductor gain material having a size-controllable, two-dimensional carrier confinement structure having a size on the order of a thermal de-Broglie wavelength; and the size of said carrier confinement structure being controlled such that the gain spectrum has discrete peaks at frequency periods of integer powers of the reciprocal of the round-trip time of the light within said optical resonator.

16. A mode-locked semiconductor laser made up of an optical resonator comprising:

a gain region that emits and amplifies light, and an optical modulation region that modulates an amplitude or a phase of the light by altering optical characteristics based on externally supplied signals; wherein:

said gain region being formed from a semiconductor gain material having a size-controllable, three-dimensional carrier confinement structure having a size on the order of a thermal de-Broglie wavelength; and the size of said carrier confinement structure is controlled such that the gain spectrum has discrete peaks at frequency periods of integer powers of the reciprocal of the round-trip time of the light in said optical resonator.

* * * * *